United States Patent [19]
Dahl

[11] Patent Number: 5,121,401
[45] Date of Patent: Jun. 9, 1992

[54] PULSED MODULATORS UTILIZING TRANSMISSION LINES

[75] Inventor: Randy L. Dahl, Mesa, Ariz.

[73] Assignee: Motorola, Inc., Schaumburg, Ill.

[21] Appl. No.: 518,630

[22] Filed: May 3, 1990

[51] Int. Cl.⁵ .............................................. H01S 3/00
[52] U.S. Cl. ........................................ 372/38; 356/5; 307/311
[58] Field of Search .................. 307/311; 372/38; 250/211 J; 356/5

[56] References Cited

U.S. PATENT DOCUMENTS

| | | |
|---|---|---|
| 4,736,380 | 4/1988 | Agoston .............................. 307/311 |
| 4,813,048 | 3/1989 | Yamane et al. ....................... 372/38 |
| 4,945,542 | 7/1990 | Brothers, Jr. ......................... 372/38 |

Primary Examiner—Edward P. Westin
Assistant Examiner—T. Davenport
Attorney, Agent, or Firm—Robert M. Handy; Maurice J. Jones

[57] ABSTRACT

The transmission line is coupled to a charging circuit and to a series circuit including a terminating resistor, the source and drain electrodes of a MOSFET and laser diode. Trigger signals are applied to the gate electrode of the MOSFET to rapidly discharge the transmisson line to provide currents of about 10 amps through the laser diode to provide pulses of light having durations of about 3 nanoseconds.

10 Claims, 3 Drawing Sheets ns or less.

PULSED MODULATORS UTILIZING TRANSMISSION LINES

CROSS REFERENCE TO A RELATED PATENT APPLICATION

The subject matter of the present application is related to the subject matter of a U.S. Patent Application entitled "Pulsed Driver Circuit" having a filing date of Apr. 2, 1990, and a Ser. No. 502,706 and which is assigned to the same assignee as the present application.

BACKGROUND OF THE INVENTION

The present invention relates in general to driver circuits and, in particular, to modulation circuits for laser diodes.

Laser diodes are presently employed in optical radar systems, for instance, which determine the range or distance between the radar and an object of interest. Modulator circuits selectively turn such diodes on and off. One prior art modulator circuit, for instance, employes a silicon controlled rectifier (SCR) connected with the laser diode and a capacitor. Controller trigger signals are applied to the gate of the SCR to render the SCR conductive to thereby discharge the capacitor through the laser diode to provide a transmitted light pulse. Other prior art circuits sometimes use a delay line in place of the capacitor. The delay line operates as a pulse forming network. Also, bipolar transistors or MOSFETs have been substituted for the SCR in some prior art configurations.

Other prior art approaches utilize either a mercury reed relay or an avalanche transistor as the switching element. Avalanche transistors have questionable reliability and uncontrollable discharge characteristics. The mercury reed switches are disadvantageous because they have low duty cycle and cannot be turned off by the control circuits.

The foregoing prior art circuits are useful for many applications wherein the rise time, fall time and/or pulse duration of the emitted light pulse are not critical. "Rise time" can be defined as the time required for the leading edge of a pulse to rise from 10% to 90% of its final value. It is a measure of the steepness of the wave front. Alternatively, "fall time" can be defined as the length of time for a pulse to decrease from 90% to 10% of its maximum amplitude. Pulse duration can also be called pulse length or pulse width. It is the time interval between points at which an instantaneous value on the leading and trailing edges bears a specified relationship to the peak pulse amplitude, for instance.

Typically the fastest light pulse rise times for prior art SCR circuits is approximately 10 nanoseconds. Such circuits are useful in optical radar systems for measuring ranges from 80 to 90 feet, for instance. The accuracy of such ranging devices is proportionate to the rise time and pulse width of the emitted pulse of light. These prior art circuits are useful for double aperture, laser diode, optical radar systems.

Alternatively, common aperture optical radars utilize one lens through which the optical pulses are transmitted and the reflected pulses are received. For these radars, it is important to precisely control the rise time, fall time and pulse duration of the transmitted pulse so that it does not interfere with the reflected pulse. High pulse repetition rates with short durations are required for measuring the range to close targets which may be within 30 feet of the radar. To obtain good distance resolution it is desirable to have pulse widths of 5 nanoseconds or less.

When the switching device of some of the above-described prior art circuits is rendered conductive, a capacitor delivers current to the laser diode. The internal series storage resistance of the capacitor and the conductors between the capacitor and the laser diode tend to limit the peak current flow. Also, the inductance provided by the conductors tends to limit the driving pulse rise time. Moreover, the total energy being delivered to the laser diode tends to change if the pulse repetition rate is increased. Furthermore, the capacitance of the capacitor tends to undesirably change with temperature change. This is because the dielectric factor of the capacitance changes with temperature, for instance. If the capacitance increases, more energy would be delivered to the laser diode thereby undesirably lengthening the pulse width with temperature increase, for instance. Thus, the prior art circuits are generally not suitable for use with close range, single aperture radar systems.

SUMMARY OF THE INVENTION

Accordingly, it is an object of the present invention to provide an inexpensive, compact and reliable modulator circuit suitable for providing accurate control of the shape of pulses having short pulse durations.

In one form, the invention relates to a modulator circuit for providing pulses of electrical energy to an electrical load such as a laser diode in response to a trigger signal. The modulator circuit includes a transmission line having an electrical charge stored therein. A normally non-conductive electron control means such as a MOSFET includes first and second main electrodes connected in a series circuit path which also includes the laser diode. The transmission line is coupled to the series path. A trigger signal supply is coupled to the control electrode of the MOSFET. The trigger signal supply provides trigger signals for rendering the MOSFET conductive between the main electrodes thereof to discharge the transmission line through the laser diode which provides a pulse of light in response thereto.

The above and other objects, features, and advantages of the present invention will be better understood from the following detailed description taken in conjunction with the accompanying drawings.

DETAILED DESCRIPTION OF THE PREFERRED EMBODIMENT

Figure 1:
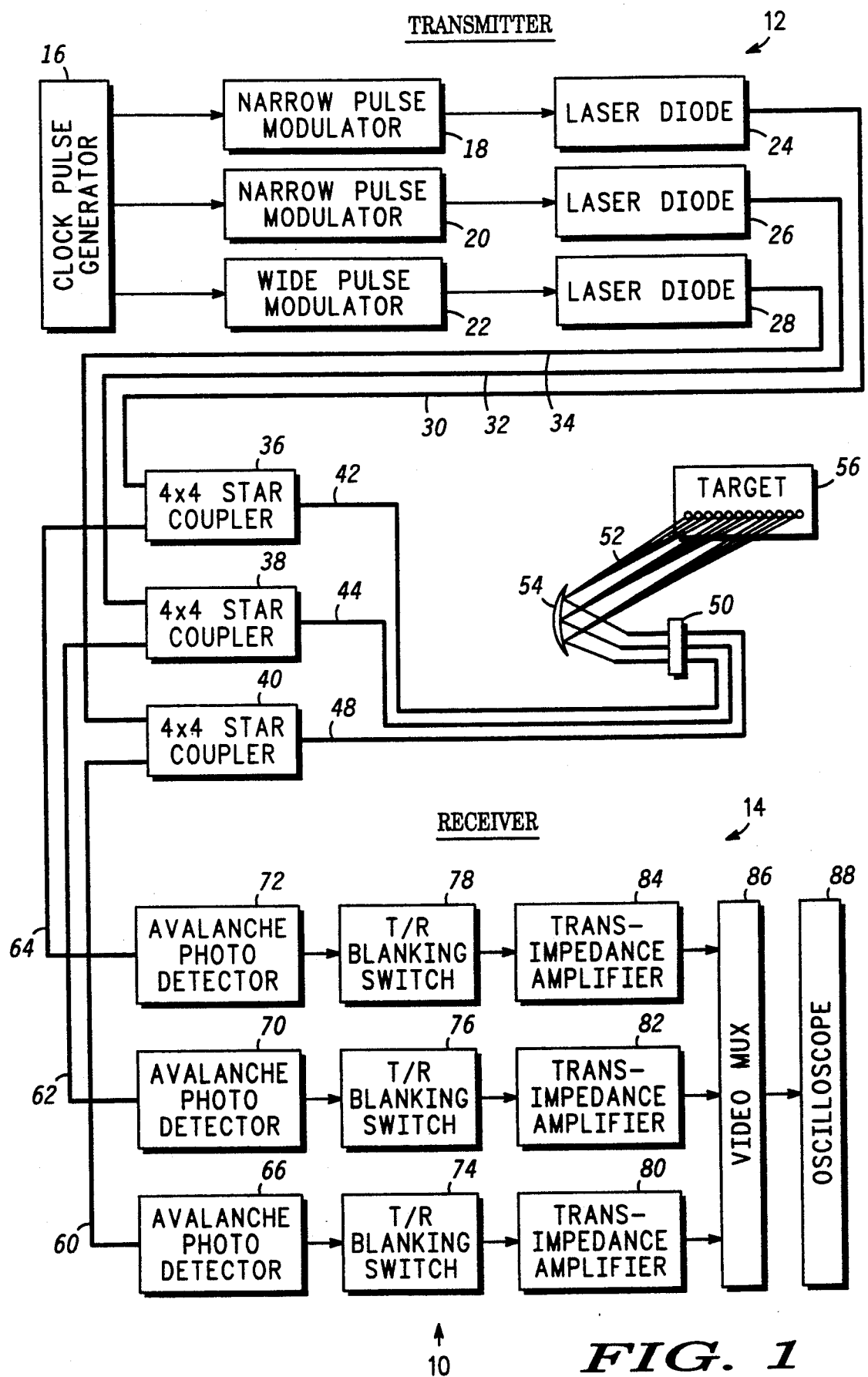
FIG. 1 is a block diagram of a single aperture optical range finder system.

FIG. 1 shows the block diagram of a common aperture optical system 10 which has a transmitter portion 12 and a receiver portion 14. Transmitter 12 includes a clock pulse generator 16, which controls narrow pulse modulators 18 and 20 and a wide pulse modulator 22. Laser diodes 24, 26, 28 are respectively driven by modulators 18, 20, 22. The optical power from laser diodes 24, 26 and 28 is coupled through respective optical fibers 30, 32 and 34 to inputs of respective star couplers 36, 38 and 40. Each star coupler functions as a bi-directional element wherein energy introduced to an input port is uniformly distributed among the output ports. Optical fibers 42, 44 and 48 are terminated at the fiber optic manifold 50 which defines the field of view shape. The light beams 52 originated by laser diodes 24, 26 and 28 and emitted from manifold 50 are reflected by spherical mirror 54 towards the target 56.

In the receive mode, light power reflected from target 56 is collected by mirror 54, focused onto the same fibers 42, 44 and 48 and distributed through star coupler 40, 38 and 36 through respective fibers 60, 62 and 64 to respective avalanche detectors 66, 70 and 72. Respective transmit-receive blanking switches 74, 76 and 78 are connected to detectors 66, 70 and 72. Transimpedance amplifiers 80, 82 and 84 are connected between outputs of respective switches 74, 76 and 78 and inputs of video multiplexer 86. Oscilloscope or display 88 is coupled to the output of video multiplexer 86.

Hence, common aperture optical system 10 uses some of the same optical elements for transmitters 12 and 14. Since both the transmit and receive fields of view are coincident, alignment between receiver 12 and transmitter 14 is maintained over all operating ranges. As a result, the background contribution and response to aerosol backscatter is minimized. Additionally, the surface area for the package for system 10 is efficiently used by having a common window for both transmitter 12 and receiver 14. Since common fiber optic light paths 42, 44 and 48 are utilized by both transmitter and receiver, it is important that the shape of the transmitted pulse be precisely controlled particularly for measuring the ranges to close in targets at a distance of less than approximately 30 feet. This is necessary so that the transmitted light pulses do not interfere with or are not interfered with by the returning light pulses from target 56. Common aperture optical system 10 therefore requires that laser diodes 24, 26 and 28 provide high power pulses having very fast rise and fall times, high repetition rates, good conversion efficiency and short durations.

Figure 2:
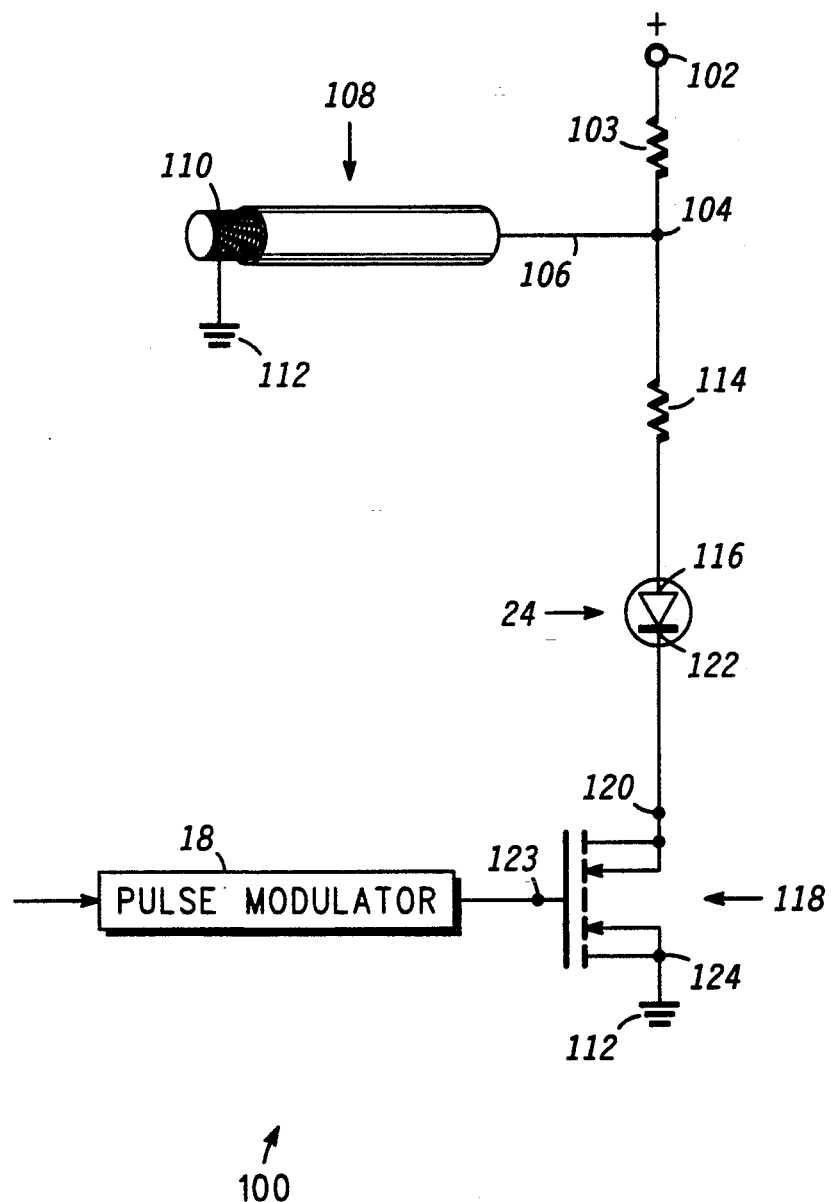
FIG. 2 is a schematic diagram of a laser diode modulator circuit employing the present invention.

FIG. 2 is a schematic diagram of a driving or modulator circuit 100 for laser diode 24. Positive power supply conductor 102 is connected through resistor 103 and node 104 to the center conductor 106 of transmission line 108. The outer conductor 110 of transmission line 108 is connected to negative or ground conductor 112. A load resistor 114 is coupled between node 104 and anode 116 of laser diode 24. MOSFET 118 includes a drain electrode 120 connected to cathode electrode 122. MOSFET 118 further includes a gate electrode 123 connected to pulse modulator 18 and a source electrode 124 connected to ground conductor 112. Pulse modulator 18 provides signals which render laser diode 24 completely conductive or non-conductive. Diode 24 can emit light in the infrared region which is just beyond the visual spectrum, for instance.

In operation, conductor 102 provides a high voltage (340 volts) through charging resistor 103 to conductor 106 of transmission line 108. Transmission line 108 is the storage element for the laser diode drive current and provides a resultant drive pulse width which is twice the propagation delay of transmission line 108. Transmission line 108 charges up in response to the charging current through resistor 103, which can have a value of 10 kilohms. Pulse modulator 18 provides a drive current such as pulse 130 shown in FIG. 3B to gate electrode 122 which renders MOSFET 118 conductive. MOSFET 118 is normally non-conductive. As a result, transmission line 108 is rapidly discharged through load resistor 114 and laser diode 24 to ground conductor 112 to provide light pulse generally shown, for example, by waveform 132 in FIG. 3A.

Transmission line 108 can be implemented by using a length of semi-rigid coaxial cable with a characteristic impedance of 10 ohms. To match the characteristic impedance of the line and thereby minimize ringing and maximizing power transfer, the impedance of the components comprising the load for the line which includes laser diode 24, MOSFET 118 and termination or load resistor 114, are made equal to the 10 ohm characteristic impedance. The magnitude of current conducted by laser diode 24 is inversely proportional to the characteristic impedance of transmission line 108. The resistance of termination resistor 114 is chosen to be approximately a couple of ohms less than the characteristic impedance. The value of termination resistor 114 of 8.2 ohms is much larger than the combined resistance of laser diode 24 and MOSFET 118 thus providing a stable load by overwhelming the non-linear attributes of the resistance of laser diode 24 and MOSFET 118.

System 10 requires an optical pulse that has less than a 5 nanosecond pulse width to satisfy the range detection goals and provide resistance to aerosol return to a sufficient power to provide adequate out range performance. To achieve this, modulator circuit 100 is required to switch currents of approximately 10 amps through laser diode 24 in approximately 2.5 nanoseconds with essentially no pulse ringing and, to have reliable operation and to be stable over temperature variations.

Figures 3A, 3B:
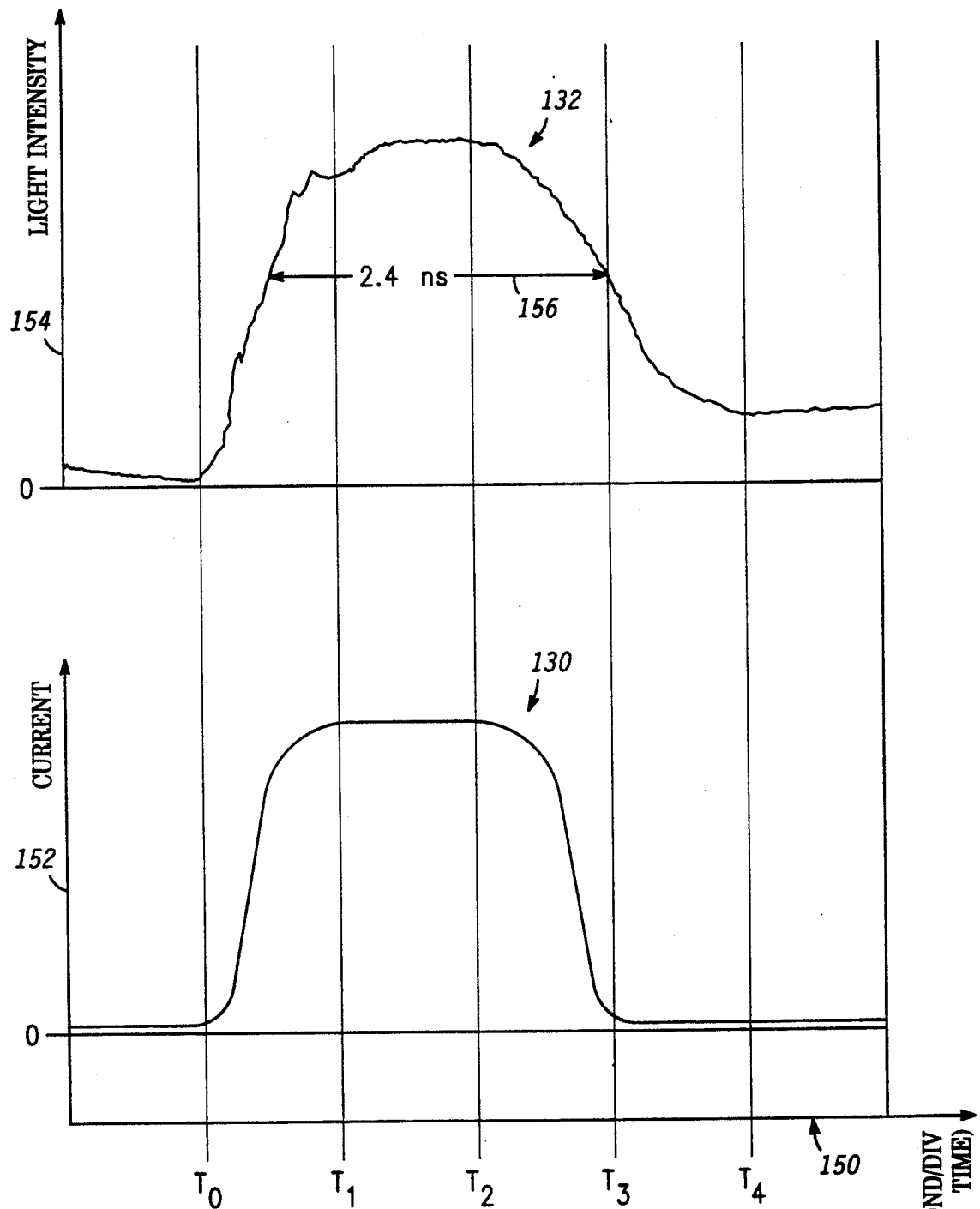
FIG. 3A and B shows waveforms illustrating the shape of the laser diode drive pulse and the resulting light pulse.

FIG. 3 illustrates the relationship between the waveforms of measured light pulse 132 of FIG. 3A and the current pulse 130 through laser diode 24 as indicated in FIG. 3B. FIG. 3B shows a graph with an abscissa axis 150 for measuring time. The scale for axis 150 is 1 nanosecond per division. Ordinate axis 152 indicates the relative magnitude of the current with respect to time. The shape of current pulse 130 has been approximated.

FIG. 3A also utilizes abscissa axis 150 for measuring time and further includes ordinate axis 152 for indicating the relative magnitude of emitted light which is measured by an optical photo detector and an oscilloscope. Waveform 132 is a duplication of an actual waveform having a fall time of 1.3 nanoseconds, a rise time of 890 picoseconds and a width of 2.4 nanoseconds (ns). The optical pulse represented by waveform 132 had power of 4.3 watts. Resistor 103 had a value of 10 kilohms and resistor 114 had a value of 8.2 ohms. Transmission line 108 was comprised of 6 inches of UT4310 cable.

A primary requirement is for MOSFET switch 118 to have a very fast turn on. MOSFET 118 may be a device Part No. DE-275 501N12 provided by Directed Energy. This MOSFET is specifically designed for high speed, high power, pulsed applications. The chosen MOSFET provides the required performance by using a microwave stripline packaging design that minimizes inherent inductances and capacitances. MOSFET 118 has a low "on" resistance between the source and drain thereof of approximately 1 ohm when rendered fully conductive.

An improved laser diode modulator 100 been disclosed as shown in FIG. 2. The disclosed range finding circuitry is capable of resolving minimal target sizes at a range of less than 30 feet. Excellent performance results have been obtained with pulse widths of less than 3.0 nanoseconds, rise times of less than 0.9 nanoseconds and fall times of less then 1.5 nanoseconds. Shorter pulse widths can be obtained at the expense of lower peak power. The pulse repetition rate can be approximately 100 kilohertz to provide rapid acquisition of targets to promote quick decisions. This performance was obtained by using short non-ferric leads, a transmission line and matched impedances. The disclosed structures can be provided in hybrid form if it is desired to meet small size constraints.

While the invention has been described in conjunction with a specific embodiment thereof, it is evident that many alterations, modifications, and variations will be apparent to those skilled in the art in light of the foregoing description. Accordingly, it is intended to include all such alterations, modifications, and variations in the appended claims.

I claim:

1. An apparatus for providing sub-microsecond light pulses in response to a control signal, comprising:
   transmission line means for storing electrical energy provided thereto prior to said control signal, and having a characteristic impedance between first and second output conductors thereof;
   resistive means having an impedance;
   a light emitting device having impedance in the "on" state; and
   a three terminal switch having a control terminal and current conducting terminals, where the current conducting terminals exhibit impedance therebetween when in the "on" state, said state varying in response to the control signal applied to the control terminal; and
   wherein the resistive means, the light emitting device and the switch are serially coupled between the first and second output conductors of the transmission line means; and
   wherein the transmission line means impedance and the sum of the impedances of the resistive means, the light emitting device and the three terminal switch are of relative magnitude so that discharging the energy stored in the transmission line means through the light emitting device produces substantially a single light pulse without ringing when the switch is turned on by the control signal.

2. The apparatus of claim 1, further including:
   power conductor means; and
   resistive means coupling said power conductor means to said transmission line means to provide said electrical energy therein.

3. The apparatus of claim 1, wherein:
   said switch includes a MOSFET means with source, drain and gate electrodes;
   said MOSFET means having a low "on" resistance on the order of 1 ohm between said source and drain electrodes and a fast rise time of approximately 1 nanosecond; and
   said source and drain electrodes corresponding to main current carrying electrodes of said switch and wherein said control signal is applied to said gate electrode.

4. The apparatus of claim 1, wherein said light emitting device includes a laser diode means.

5. The apparatus of claim 4, wherein:
   said resistive means has a resistance approximately equal to about eighty percent of the characteristic impedance of said transmission line means.

6. A modulator circuit for providing pulses of electrical energy to a laser diode means in response to a trigger signal, the modulator circuit including in combination:
   transmission line means having first and second conductors;
   means for charging said transmission lines means to store energy therein between said pulses;
   normally non-conductive MOSFET means having drain, source and gate electrodes;
   resistive means;
   said resistive means and said laser diode means and said source and drain electrodes of said MOSFET means coupled in a series circuit path between the first and second conductors of said transmission line means; and
   wherein said trigger signal applied to said gate renders said MOSFET means conductive to thereby discharge said transmission line means through said series circuit path to provide a pulse of electrical energy to said laser diode means.

7. The modulator circuit of claim 6, wherein:
   said transmission line means has a predetermined characteristic impedance; and
   said series circuit path is arranged to provide a load resistance to said transmission line means which approximately equals said characteristic impedance when said MOSFET means is rendered conductive.

8. An optical ranging apparatus, comprising:
   a receiver means for detecting reflected optical ranging pulses;
   a transmitter means for producing optical ranging pulses, the transmitter means including a trigger circuit coupled to a driver circuit and including a laser diode for providing the optical ranging pulses, the laser diode having anode and cathode electrodes;
   wherein the driver circuit includes:
      first and second power supply conductors;
      transmission line means having a first conductor and a second conductor, said second conductor being coupled to one of said power supply conductors;
      circuit means coupling the other of said power supply conductors to the first conductor of said transmission line means to provide a charge on said transmission line means;
      resistive means coupled between said first conductor of said transmission line means and one of the anode and cathode electrodes of the laser diode;
      normally non-conductive electron control means coupled in series with said resistive means and said laser diode means and said first and second conductors of said transmission line means; and
      the trigger circuit being coupled to said control electrode of said electron control means for rendering said electron control means conductive in response to a trigger signal to discharge said transmission line means through said laser diode means to provide a pulse of electrical energy having a rapid rise time to the laser diode in response to the trigger signal.

9. The optical ranging apparatus of claim 8, wherein said electron control means includes a normally non-conductive MOSFET means.

10. The optical ranging apparatus of claim 9, wherein:
   said transmission line has a predetermined characteristic impedance; and
   said resistive means and said laser diode means and said MOSFET means being arranged to provide an impedance having a magnitude approximately equal to the magnitude said characteristic impedance when said MOSFET means is rendered conductive.

* * * * *